(12) United States Patent
Laurier et al.

(10) Patent No.: US 6,211,711 B1
(45) Date of Patent: Apr. 3, 2001

(54) ACTIVATION SIGNAL GENERATING CIRCUIT

(75) Inventors: Bernadette Laurier, Saint Egreve; Charles Odinot, La Tronche, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/229,938

(22) Filed: Jan. 13, 1999

(30) Foreign Application Priority Data

Jan. 14, 1998 (FR) .................................................. 98 00319

(51) Int. Cl.$^7$ ........................................................ H03K 3/12
(52) U.S. Cl. .......................... 327/199; 327/291; 327/299
(58) Field of Search ........................................ 327/256, 365, 327/404, 403, 407, 291, 408, 199, 200, 294, 299

(56) References Cited

U.S. PATENT DOCUMENTS

| | | | |
|---|---|---|---|
| 4,855,623 | * 8/1989 | Flaherty | 326/87 |
| 5,625,630 | 4/1997 | Abramovici et al. | 714/724 |
| 5,883,529 | * 3/1999 | Kumata et al. | 326/93 |
| 6,014,038 | * 11/2000 | How et al. | 326/46 |

FOREIGN PATENT DOCUMENTS 0 315 473    5/1989   (EP) .

OTHER PUBLICATIONS

"CMOS Circuits", Prentice–Hall, XP–000274349, 1997, pp. 85–90, figure 2–48.

French Search Report dated Aug. 13, 1998 with annex on French Application No. 98 00319.

* cited by examiner

Primary Examiner—Tuan T. Lam
Assistant Examiner—Hiep Nguyen
(74) Attorney, Agent, or Firm—Theodore E. Galanthay; Stephen C. Bongini; Fleit, Kain, Gibbons, Gutman & Bongini P.L.

(57) ABSTRACT

An activation signal generating circuit includes a combinational logic circuit and a switch. The combinational logic circuit receives a normal mode control signal and a test mode control signal, and the switch receives a periodic clock signal. The switch is controlled by the output of the combinational logic circuit such that an activation signal is generated from the periodic clock signal. In one preferred embodiment, the switch is a CMOS change-over switch having two complementary MOS transistors connected in parallel, and a potential setting circuit imposes a specified potential at the output of the switch when the switch is open. A method of generating an activation signal is also disclosed.

28 Claims, 2 Drawing Sheets

ACTIVATION SIGNAL GENERATING CIRCUIT

CROSS-REFERENCE TO RELATED APPLICATIONS

This application is based upon and claims priority from prior French Patent Application No. 98-00319, filed Jan. 14, 1998, the entire disclosure of which is herein incorporated by reference.

BACKGROUND OF THE INVENTION

1. Field of the Invention

The present invention relates to integrated circuits, and more specifically to a circuit for generating a controlled activation signal.

2. Description of Related Art

Digital integrated circuits such as microprocessors, microcontrollers, semiconductor memories, applications specific integrated circuits (ASICs), and programmable logic arrays (PLAs) are now widely used in electronic systems. After such integrated circuits are manufactured, they must be tested to insure proper operation. Because it is not practical to individually test every elementary logic circuit (e.g., transistor) in the integrated circuit for every possible situation, the testing is typically limited to the application of test vectors (or stimuli) to the inputs of the integrated circuit. For each stimulus, a comparison is made of the logic signals output by the integrated circuit and the expected output.

Generally, an external apparatus ("tester") is used to generate the input test vectors. The tester is driven by an automatic test pattern generation program that employs an automatic test pattern generation (ATPG) algorithm. For each possible defect being considered, the program determines the stimuli that will propagate the defect to the outputs of the integrated circuit. However, not all defects are capable of being detected so the exhaustivity of the testing (i.e., the ratio of the number of detectable faults to the number of possible faults) is rarely equal to 100%.

In order to increase the exhaustivity of the testing, it has been proposed to introduce into the integrated circuit access and observation devices such as shift registers. Such a shift register is formed by connecting the internal storage registers of the integrated circuit in series in a test mode. In normal mode, the storage registers fulfil their normal circuit functions. Thus, the storage registers have a twofold use: normal mode use as internal storage registers, and test mode use as part of a shift register that operates as an access and observation device for a logic unit of the integrated circuit being tested. To allow for such dual operation, the internal storage registers are both connected in series with one another and connected in parallel to the inputs or outputs of the logic unit to be tested.

FIG. 1 shows an internal storage register of an integrated circuit. A D flip-flop FF has a clock input CL that is sensitive to a signal edge (as is indicated by the ">" sign). That is, the flip-flop stores the logic value present at the input D when a signal edge (e.g., a leading edge) arrives at the clock input CL, and delivers the stored logic value to the output Q when the next leading edge arrives at the clock input CL. Thus, logic values are stored in the flip-flop FF between two leading edges of the activation signal CLK. (The internal storage registers of the integrated circuit can also or alternatively be formed by devices that are sensitive to voltage levels and not signal edges, such as logic latches.)

During operation, an activation signal CLK is supplied to the clock input CL of the flip-flop. In normal mode, the activation signal is generated from a periodic clock signal H (e.g., the clock signal of the system that includes the integrated circuit) and a control signal E. More specifically, the clock signal H and the control signal E are combined in an AND operation using an AND gate 5 or a controlled switch (e.g., a MOS transistor or a tristate logic gate controlled by the control signal). The control signal E is generated from other internal signals of the integrated circuit through sequential and/or combinational logic so as to generate the activation signal CLK when necessary. When active, the control signal E allows the clock signal H to be transmitted as the activation signal CLK to the clock input CL of the flip-flop.

In test mode, the integrated circuit can be tested according to the scan test method. In the scan test method, in a loading phase, data elements are serially transmitted through the sift register to each of the flip-flops forming the shift register, and the outputs of the flip-flops are connected to inputs of the logic unit to be tested. In a capture phase, the operation under test is started and the output data elements are transmitted through the logic unit to the inputs of other flip-flops for storage. Then, in an extraction phase, the captured data elements are serially transmitted through the shift register to an output of the integrated circuit for analysis by the tester.

To use the scan test method, additional circuitry must be provided for configuring the flip-flops of the integrated circuit as part of a shift register that provides access to and observation of the logic unit to be tested. In particular, the additional circuitry allows a test mode activation signal to be provided to the clock inputs of the flip-flops of the shift register in the test mode. The test mode activation signal is generated using the periodic clock signal H described above and a test mode control signal (e.g., a control signal that is delivered from the tester to an input of the integrated circuit).

SUMMARY OF THE INVENTION

In view of these drawbacks, it is an object of the present invention to remove the above-mentioned drawbacks and to provide a simple and reliable way to generate a single activation signal from a normal mode control signal and a test mode control signal. The normal mode control signal and the test mode control signal are combined with each other before interacting with the periodic clock signal. As a result, the distortion in the activation signal that is generated from the periodic clock signal is limited. This is particularly advantageous when the internal storage registers are formed by devices such as flip-flops that are activated by the edges of the activation signal.

One embodiment of the present invention provides an activation signal generating circuit that includes a combinational logic circuit and a switch. The combinational logic circuit receives a normal mode control signal and a test mode control signal, and the switch receives a periodic clock signal. The switch is controlled by the output of the combinational logic circuit such that an activation signal is generated from the periodic clock signal. In one preferred embodiment, the switch is a CMOS change-over switch having two complementary MOS transistors connected in parallel, and a potential setting circuit imposes a specified potential at the output of the switch when the switch is open. A method of generating an activation signal is also provided.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings. In the various figures, the same elements bear the same reference labels. Additionally, it is assumed that the circuits are operating under positive logic. Specifically, an active signal is equal to logic 1 and an inactive signal is equal to logic 0.

Figure 1:
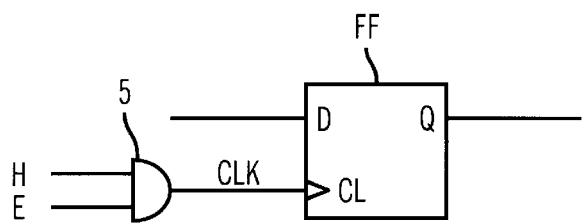
FIG. 1 is a block diagram showing an internal storage register that is formed by a flip-flop.
Figure 2A:
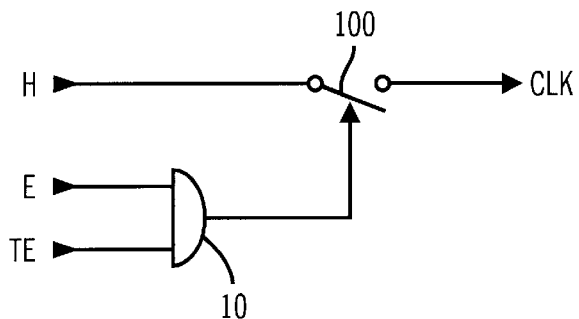
FIGS. 2a through 2c are block diagrams showing relevant signal paths in various embodiments of the present invention.

The relevant signal paths in one embodiment of the present invention are shown in FIG. 2a. A normal mode control signal E and a test mode control signal TE are combined in an OR operation. While an OR gate 10 is symbolically shown as the combinational circuit for performing the logic operation, the drawing is not meant to restrict the circuitry that can used in practical implementations. For example, the combinational circuit could also be formed by a wired logic OR gate, a NOR gate that receives the normal mode control signal E and the test mode control signal TE, or the like.

The combinational circuit 10 controls a switch 100 so as to generate an activation signal CLK from a periodic clock signal H. Again, the controlled switch 100 is merely symbolic and could be formed by a tristate gate, a MOS transistor that is controlled by its gate, a CMOS change-over switch, or the like. For simplicity, the controlled switch has only two states that are alternately selected as a function of the result of the combination of the control signals E and TE in the combinational circuit 10. In the first state, the switch 100 is closed and delivers the periodic clock signal H at the output for the activation signal CLK. In the second state, the switch 100 is open so its output is in the high impedance state and no signal is delivered.

Figure 2B:
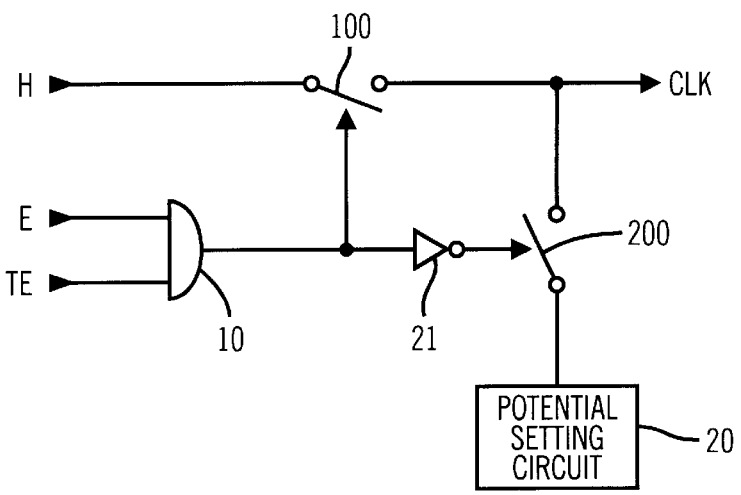

FIG. 2b shows the relevant signal paths in an embodiment that is an advantageous variant of the embodiment of FIG. 2a. As shown, the signal generation circuit is altered to also include a potential setting circuit that sets a specified potential for the activation signal CLK when the controlled switch 100 is open. The potential setting circuit has a second controlled switch 200 that is connected between a DC voltage source 20 and the output for the activation signal CLK, and the second switch 200 is controlled by the logical complement of the signal controlling the first switch 100. For example, an inverter 21 can be provided between the output of the combinational circuit 10, which generates the signal controlling the first switch 100, and the control input of the second switch 200.

Thus, the potential setting circuit 20, 21, and 200 imposes the DC voltage from the DC voltage source at the output for the activation signal CLK when the first switch 100 is opened. As a result, the activation signal CLK is equal to the periodic clock signal H when the first switch 100 is closed and to a specified DC signal when the first switch 100 is open. Because of the added potential setting circuit, the phenomena of voltage drift of the output of the first switch (i.e., the activation signal) when the switch is in the high impedance state is prevented. In other words, signal "glitches" that could cause erratic functioning of the flip-flops that receive the activation signal are eliminated.

Figure 2C:
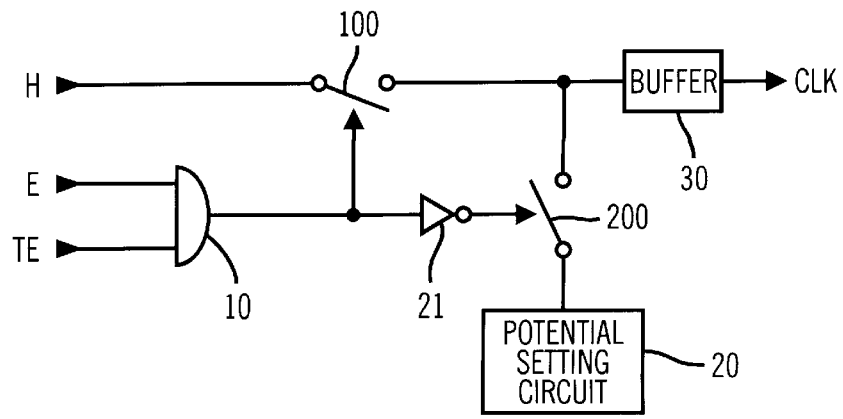

FIG. 2c shows the relevant signal paths in an embodiment that is another advantageous variant of the embodiment of FIG. 2a. As shown, the signal generation circuit additionally includes an output or buffer circuit 30 that increases the fan-out of the activation signal CLK. In other words, the buffer circuit increases the output current of the signal generation circuit.

Figure 3:
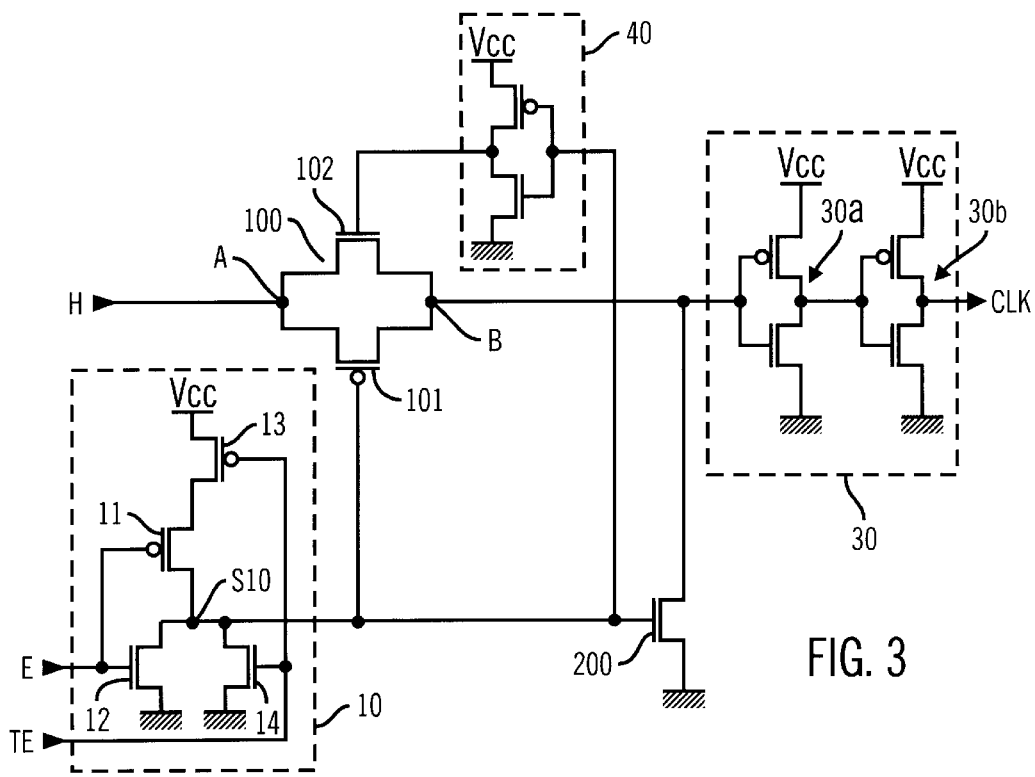
FIG. 3 is a schematic diagram showing a signal generation circuit according to a preferred embodiment of the present invention.

A preferred embodiment of the signal generation circuit of the present invention will now be described in detail with reference to the schematic diagram of FIG. 3. The preferred embodiment includes the basic elements of the embodiment shown in the block diagram of FIG. 2c, and could easily be modified by one of ordinary skill in the art to implement the embodiment shown in FIG. 2a or the embodiment shown in FIG. 2b.

The combinational circuit 10 for performing an OR operation between the normal mode control signal E and the test mode control signal TE is formed by a CMOS two-input NOR gate. As shown, two P-type MOS transistors 11 and 13 are connected in series between a positive supply terminal Vcc and an output node S10, and two N-type MOS transistors 12 and 14 are connected in parallel between the output node S10 and a negative supply terminal (e.g., ground). The gates of two of the transistors 11 and 12 form the first input of the NOR gate and receive the normal mode control signal E. Similarly, the gates of the other two transistors 13 and 14 form the second input of the NOR gate and receive the test mode control signal TE.

The first switch 100 is a CMOS change-over switch that is formed by a P-type MOS transistor 101 and an N-type MOS transistor 102 that are connected in parallel and controlled by complementary signals. A first node A, which is common to the source of the PMOS transistor 101 and the drain of the NMOS transistor 102, forms the input of the change-over switch and receives the periodic clock signal H. Another node B, which is common to the drain of the PMOS transistor 101 and the source of the NMOS transistor 102, forms the output of the change-over switch and delivers an activation signal that is a reproduction of the periodic clock signal H when the change-over switch is closed. In other words, when the switch is closed, the periodic clock signal H is transmitted to the output B of the change-over switch as the activation signal.

The control gate of the PMOS transistor 101 of the change-over switch is connected to the output node S10 of the NOR gate 10, and the control gate of the NMOS transistor 102 is connected to the output node S10 through an inverter 40. In the preferred embodiment, the inverter 40 is a CMOS inverter formed by an NMOS transistor and a PMOS transistor that are connected in series between the positive supply terminal Vcc and ground. The gates of the two transistors are connected together to form the input of the inverter, and the output of the inverter is supplied at the drains of the two transistors. The provision of the inverter 40 causes the two complementary transistors 101 and 102 of the change-over switch 100 to receive complementary logic signals.

By using a CMOS change-over switch as the controlled switch 100, the edges of the clock signal H are not deformed at the output of the switch. Additionally, the switching speed of a MOS transistor differs depending on whether the transistor transitions from off to on or from on to off, and the switching speed also differs for N-type and P-type transistors because of the difference in mobility of the charge carriers (i.e., electrons and holes, respectively). In the circuit of FIG. 3, the parallel connection of two complementary MOS transistors that are controlled by complementary logic signals provides for the parallel connection of the resistors $R_{on}$ of each of the transistors when simultaneously in the on state. Thus, the impedance of the change-over switch is substantially equal to $R_{on}/2$. Conversely, when only one of the transistors of the change-over switch is on, the impedance is substantially equal to $R_{on}$. Thus, the parallel-connected transistors limit the distortion of the logic signal passing through the switch.

In accordance with the embodiments of FIGS. 2b and 2c, the signal generation circuit includes circuitry that imposes a specified potential on the output of the change-over switch 100 when the switch is open. In the preferred embodiment of FIG. 3, this circuitry is simply formed by a single NMOS transistor 200 whose drain is connected to the output node B of the change-over switch 100 and whose source is connected to the negative supply potential (e.g., ground). The gate of the NMOS transistor 200 receives a logic signal that makes the transistor conductive so as to impose the negative potential on the output node B when neither the normal mode control signal E nor the test mode control signal TE is active. Because the OR circuitry 10 is formed by a NOR gate in the embodiment of FIG. 3, the NMOS transistor 200 can be properly controlled by simply connecting its gate to the output node S10 of the NOR gate.

By imposing a specified potential on the output of the controlled switch when the switch is open, the output node B is prevented from being in a float state when the switch is open. Conversely, in the absence of the NMOS transistor 200, the output node B would be in the high impedance state when the switch was open. In such a state, uncontrolled voltage drift or glitch (e.g., due to the capacitive nature of the connections) can cause the output node to reach a voltage that is sufficient to be wrongly interpreted as a logic level and/or to have an edge that causes the integrated circuit to dysfunction.

In accordance with the embodiments of FIG. 2c, the signal generation circuit includes an output buffer circuit 30 that connected to the output node B of the controlled switch 100 to deliver the activation signal CLK. The buffer circuit 30 is formed by at least one inverter and, in the preferred embodiment of FIG. 3, is formed by two CMOS inverters 30a and 30b. The inverters of the buffer circuit, and especially the second inverter 30b, have dimensions that are large enough for the circuit to have a fan-out equal to the number of flip-flops that the activation signal CLK must simultaneously activate. The number of inverters cascade-connected in the buffer circuit 30 depends on the logic level assigned as the active state of the activation signal CLK. More specifically, the edges of the activation signal CLK are in phase with edges of the periodic clock signal H when there are an even number of inverters, and the edges of the activation signal CLK are in opposing phases with the edges of the periodic clock signal H when there are an odd number of inverters.

In the present invention, the signal resulting from the logical combination of the normal mode control signal and the test mode control signal controls the transmission of the clock signal H to the output of the signal generation circuit. As a result of this logical combination, it is ensured that the test mode control signal TE, which is active for the duration of the test, totally inhibits the normal mode control signal E. Otherwise, the normal mode control signal (which is typically generated by circuitry that is not controlled in test mode) could disturb the operation of the integrated circuit in the test mode.

Furthermore, by using the logical combination signal to control the switch, the periodic clock signal H only has to be transmitted through the controlled switch 100. Thus, the distortion of the edges of the generated activation signal is limited. This is particularly advantageous when a CMOS change-over switch is used for the a controlled switch. Additionally, because all the circuitry (especially the NOR gate, switch, inverter, and buffer circuit) of the signal generation circuit of the present invention can be formed using CMOS technology, the circuit has very low static current consumption. This is especially advantageous because the circuitry are inactive most of the time the integrated circuit is in operation.

Figure 4:
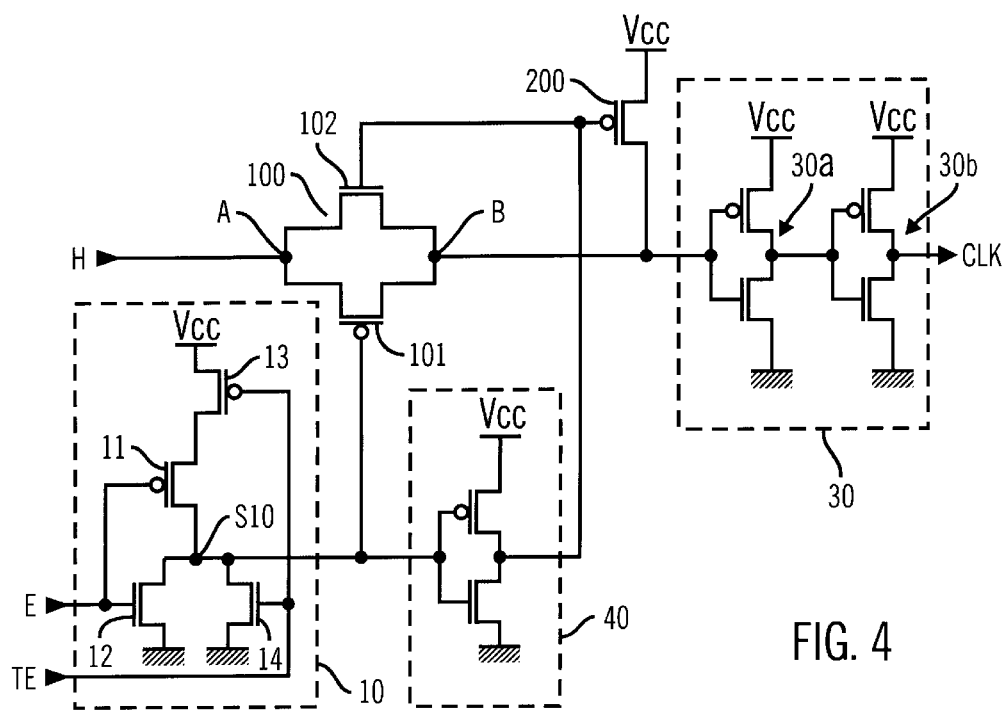
FIG. 4 is a schematic diagram showing a signal generation circuit according to another embodiment of the present invention.

FIG. 4 shows another embodiment of the signal generation circuit of the present invention. This embodiment is identical to the embodiment of FIG. 3 except for the nature of the circuitry that imposes the specified potential on the output of the controlled switch 100 when the switch is open. In particular, in the embodiment of FIG. 4, this circuitry is formed by a PMOS transistor 200 that has its drain connected to the output of the controlled switch 100 and its source connected to the positive supply terminal Vcc. The control gate of the PMOS transistor 200 receives a logic signal that makes the transistor conductive so as to impose the positive potential on the output node B when neither the normal mode control signal E nor the test mode control signal TE is active. Because the OR circuitry 10 is formed by a NOR gate, the PMOS transistor 200 can be properly controlled by simply connecting its gate to the output of the inverter 40 to cause the reception of the complement of the output signal of the NOR gate.

While the embodiments of the present invention described above use a NOR-type logic gate for the combinational circuit, in further embodiments the combinational circuit is formed using an OR-type logic gate or the like. In such embodiments, the inverter that generates the complementary signal must be shifted to properly operate the controlled switch and the circuitry that imposes a potential at the output of the controlled switch.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. An activation signal generating circuit for generating an activation signal from a periodic clock signal the activation signal being selectively supplied as a clock signal to a circuit under test in a normal operating mode based on a normal mode control signal, and being selectively supplied as a scan test signal to clock inputs of flip-flops of the circuit under test in a test mode based on a test mode control signal said activation signal generating circuit comprising:

a combinational logic circuit that receives the normal mode control signal and the test mode control signal; and a switch that receives the periodic clock signal, the switch being controlled by the output of the combinational logic circuit, wherein the combinational logic circuit controls the switch such that the switch selectively transfers the periodic clock signal as the activation signal based on the output of the combinational logic circuit, and the switch is a CMOS change-over switch having two complementary MOS transistors connected in parallel, the two transistors being controlled by complementary signals.

2. The activation signal generating circuit as defined in claim 1, wherein the combinational logic circuit performs an OR-type logic operation.

3. The activation signal generating circuit as defined in claim 1, wherein the combinational logic circuit includes a CMOS NOR gate having one input receiving the normal mode control signal and another input receiving the test mode control signal.

4. The activation signal generating circuit as defined in 1, wherein the output of the combinational logic circuit is supplied to the control gate of one of the MOS transistors, and the output of the combinational logic circuit is supplied to the control gate of the other of the MOS transistors through an inverter.

5. The activation signal generating circuit as defined in claim 1, further comprising a potential setting circuit that imposes a specified potential at the output of the switch when the switch is open.

6. The activation signal generating circuit as defined in claim 5, wherein the potential setting circuit includes an NMOS transistor having a drain connected to the output of the switch, a source connected to a negative supply potential or ground, and a control gate receiving a logic signal that makes the NMOS transistor conductive when neither the normal mode control signal nor the test mode control signal is active.

7. The activation signal generating circuit as defined in claim 6, wherein the combinational logic circuit includes a CMOS NOR gate having one input receiving the normal mode control signal and another input receiving the test mode control signal, and the output of the CMOS NOR gate is coupled to the control gate of the NMOS transistor.

8. The activation signal generating circuit as defined in claim 5, wherein the potential setting circuit includes a PMOS transistor having a drain connected to the output of the switch and a source connected to a positive supply potential, the PMOS transistor being controlled so as to be conductive only when neither the normal mode control signal nor the test mode control signal is active.

9. The activation signal generating circuit as defined in claim 8, wherein the combinational logic circuit includes a CMOS NOR gate having one input receiving the normal mode control signal and another input receiving the test mode control signal, and a complement of the output of the NOR gate is supplied to the control gate of the PMOS transistor.

10. The activation signal generating circuit as defined in claim 9, wherein the switch is a CMOS change-over switch having two complementary MOS transistors connected in parallel, the output of the combinational logic circuit is supplied to the control gate of one of the MOS transistors of the switch, the output of the combinational logic circuit is supplied to the control gate of the other of the MOS transistors of the switch through an inverter, and the control gate of the PMOS transistor of the potential setting circuit is connected to the output of the inverter.

11. The activation signal generating circuit as defined in claim 1, further comprising a buffer circuit having at least one inverter with dimensions that allow the buffer circuit to have a fan-out at least equal to a number of flip-flops that the activation signal must simultaneously activate.

12. The activation signal generating circuit as defined in claim 1, wherein the flip-flops form at least one storage register in the circuit under test.

13. An integrated circuit comprising:

an operational circuit that operates in a normal mode and a test mode the operational circuit including a plurality of flip-flops that form at least one storage register, the flip-flops being configured as a shift register in the test mode;

a combinational logic circuit that receives a normal mode control signal and a test mode control signal; and a switch that receives a periodic clock signal, the switch being controlled by the output of the combinational logic circuit, wherein the combinational logic circuit controls the switch such that the switch selectively transfers the periodic clock signal as an activation signal based on the output of the combinational logic circuit, the activation signal being selectively supplied to the flip-flops as a clock signal in the normal mode based on the normal mode control signal, and being selectively supplied to clock inputs of the flip-flops as a scan test signal in the test mode based on the test mode control signal.

14. The integrated circuit as defined in claim 13, wherein the combinational logic circuit includes a CMOS NOR gate having one input receiving the normal mode control signal and another input receiving the test mode control signal.

15. The integrated circuit as defined in 13, wherein the switch is a CMOS changeover switch having two complementary MOS transistors connected in parallel, the two transistors being controlled by complementary signals.

16. The integrated circuit as defined in claim 13, further comprising a potential setting circuit that imposes a specified potential at the output of the switch when the switch is open.

17. The integrated circuit as defined in claim 16, wherein the potential setting circuit includes an NMOS transistor having a drain connected to the output of the switch, a source connected to a negative supply potential or ground, and a control gate receiving a logic signal that makes the NMOS transistor conductive when neither the normal mode control signal nor the test mode control signal is active.

18. The integrated circuit as defined in claim 16, wherein the potential setting circuit includes a PMOS transistor having a drain connected to the output of the switch, a source connected to a positive supply potential, and a control gate receiving a logic signal that makes the PMOS transistor conductive when neither the normal mode control signal nor the test mode control signal is active.

19. The integrated circuit as defined in claim 13, further comprising a buffer circuit having at least one inverter with dimensions that allow the buffer circuit to have a fan-out at least equal to the number of flip-flops.

20. An information handling system including at least one integrated circuit that operates in a normal mode and a test mode, said integrated circuit comprising:

a plurality of flip-flops that form at least one storage register;

a combinational logic circuit that receives a normal mode control signal and a test mode control signal; and a switch that receives a periodic clock signal, the switch being controlled by the output of the combinational logic circuit, wherein the combinational logic circuit controls the switch such that the switch selectively transfers the periodic clock signal as an activation signal based on the output of the combinational logic circuit, the activation signal being selectively supplied to the flip-flops as a clock signal in the normal mode based on the normal mode control signal and being selectively supplied to clock inputs of the flip-flops as a scan test signal in the test mode based on the test mode control signal.

21. The information handling system as defined in claim 20, wherein the combinational logic circuit includes a CMOS NOR gate having one input receiving the normal mode control signal and another input receiving the test mode control signal.

22. The information handling system as defined in 20, wherein the switch is a CMOS change-over switch having two complementary MOS transistors connected in parallel, the two transistors being controlled by complementary signals.

23. A method of generating an activation signal, said method comprising the steps of:

logically combining a normal mode control signal and a test mode control signal;

receiving a periodic clock signal;

after logically combining the normal mode control signal and the test mode control signal selectively providing the periodic clock signal as the activation signal based on the result of the logical combination of the control signals; and supplying the activation signal to a plurality of flip-flops that form at least one storage register, the activation signal being supplied to the flip-flops as a clock signal in a normal operating mode and being supplied to the flip-flops as a scan test signal in a test mode.

24. The method as defined in claim 23, wherein the logical combination is an OR-type logical combination.

25. The method as defined in 23, wherein the step of selectively providing the periodic clock signal includes the sub-step of selectively opening a switch based on the result of the logical combination of the control signals.

26. The method as defined in claim 23, further comprising the step of setting the activation signal to a specified potential when the periodic clock signal is not provided as the activation signal.

27. The method as defined in claim 23, further comprising the step of buffering the activation signal to increase the output current so that the activation signal can be supplied to the number of flip-flops that must be simultaneously activated.

28. A method of generating an activation signal for an operational circuit that operates in a normal mode and a test mode, said method comprising the steps of:

logically combining a normal mode control signal and a test mode control signal;

receiving a periodic clock signal;

after logically combining the normal mode control signal and the test mode control signal, selectively providing the periodic clock signal as the activation signal based on the result of the logical combination of the control signals;

supplying the activation signal as a clock signal to a plurality of flip-flops of the operational circuit in the normal mode;

configuring the flip-flops of the operational circuit as a shift register in the test mode; and supplying the activation signal as a scan test signal to the flip-flops of the operational circuit in the test mode.

* * * * *